US008451072B2

(12) United States Patent  (10) Patent No.: US 8,451,072 B2
Wyland  (45) Date of Patent: May 28, 2013

(54) METHOD FOR TRANSMISSION LINES USING META-MATERIALS

(75) Inventor: Christopher Wyland, San Jose, CA (US)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 767 days.

(21) Appl. No.: 12/525,583

(22) PCT Filed: Jan. 24, 2008

(86) PCT No.: PCT/IB2008/050263
§ 371 (c)(1),
(2), (4) Date: Aug. 3, 2009

(87) PCT Pub. No.: WO2008/096283
PCT Pub. Date: Aug. 14, 2008

(65) Prior Publication Data
US 2010/0131906 A1   May 27, 2010

Related U.S. Application Data

(60) Provisional application No. 60/887,765, filed on Feb. 1, 2007.

(51) Int. Cl.
*H04B 3/28* (2006.01)
*H03H 7/00* (2006.01)

(52) U.S. Cl.
USPC ............................................ 333/12; 333/185

(58) Field of Classification Search
USPC .................................................. 333/12, 185
See application file for complete search history.

(56) References Cited

FOREIGN PATENT DOCUMENTS
WO   WO2007/069224 A   6/2007

OTHER PUBLICATIONS

International preliminary report mailed in PCT/IB2008/050263 on Aug. 20, 2009.
Staiculescu D. et al: "Microwave/Millimeter Wave Metamaterial Development Using the Design of Experiments Technique" Wireless Communications and Applied Computational Electromagnetics, 2005, pp. 417-420. XP010826420.
Ching-Ying, Cheng et al: "Tailoring double-negative metamaterial responses to achieve anomalous propagation effects along microstrip transmission lines" IEEE Transactions on Microwave Theory and Techniques, vol. 51, No. 12., pp. 2306-2314. XP011105118, Dec. 2003.
Chris Wyland Ed-Xing Wang et al: "Use of negative permeability metamaterials to improve signal impedance" Signal Propagation on Interconnects, 2006, pp. 287-289. XP031012740.
C. Wijland: "Use of negative permeability metamaterials to improve signal impedance" Phillips Semiconductors, IMO BE Innovation—SJ, 2006, pp. 1-14. XP002481997.
A.F. Srarr et al: "Fabrication and characterization of a negative-refractive-index composite metamaterial" Physical Review B, 2004, pp. 113102-1-113102-4. XP002481998.

*Primary Examiner* — Robert Pascal
*Assistant Examiner* — Kimberly Glenn
(74) *Attorney, Agent, or Firm* — McClure, Qualey & Rodack, LLP

(57) ABSTRACT

High frequency circuits for wireless, digital and microwave applications place requirements upon the impedance of their signal lines, interconnects and packaging. In designing and implementing the substrates for these signal lines it is beneficial to employ meta-materials to provide the desired impedance. Such meta-materials providing a means to provide modified permittivity and permeability for the substrate, these being different than the real permittivity and permeability of the insulator used. In an example embodiment, a substrate is configured as a meta-material. It is desirable therefore to have a means to model these meta-material aspects of the signal lines rapidly and accurately allowing the circuits, interconnects and packages to be designed and implemented without expensive and exhaustive iterative experimental characterization. Within the cited invention design parameters for the meta-material structure are determined in dependence upon input parameters characterizing the conductive medium, dielectric medium enveloping the conductive material, and the pre-determined shapes of the conductive medium.

18 Claims, 11 Drawing Sheets

METHOD FOR TRANSMISSION LINES USING META-MATERIALS

CROSS-REFERENCE TO RELATED APPLICATION

This application is related to copending U.S. Provisional Application Ser. No. 60/887,765, filed on Feb 1, 2007, which is entirely incorporated herein by reference. This application also claims priority to, and the benefit of, PCT Application No. PCT/IB2008/050263 entitled, "Design Method for Transmission Lines Using Meta-Materials,"filed on Jan. 24, 2008, which is entirely incorporated herein by reference.

The invention relates to microwave transmission lines and more particularly to the design of transmission lines on substrates incorporating meta-materials.

The electronics industry continues to rely upon advances in semiconductor technology to realize higher-function devices in more compact areas. For many applications realizing higher-functioning devices requires integrating a large number of electronic devices into a single semiconductor wafer. As the number of electronic devices per given area of the wafer increases, the manufacturing processes become more difficult.

Many varieties of semiconductor devices have been manufactured with various applications in numerous disciplines. Such semiconductor devices often include metal-oxide-semiconductor field-effect transistors (MOSFET), such as p-channel MOS (PMOS), n-channel MOS (NMOS) complementary MOS (CMOS) transistors, and CMOS with bipolar transistors, BiCMOS.

Concurrently with the drive for increased functional integration, there are similar drives for improved speed of the semiconductor devices, where they are digital devices, and improved noise, sensitivity, power and operating frequencies where they are analog devices such as within wireless and RF technology. In many instances of today's consumer electronics these digital, wireless and RF technologies are deployed simultaneously within portable and hand-held units. As a result today's semiconductor based devices typically include semiconductors based upon silicon, silicon germanium, and gallium arsenide material systems. However, others such as gallium nitride and indium phosphide are commercially available and deployed where the power, efficiency and operating frequency requirements lie outside those of the typical material systems.

Today most microprocessors operate at speeds of 2 GHz, with some such as Intel Pentium 4 Extreme operating internally at 3.6 GHz. Most single chip wireless transceivers or wireless chip sets operate at frequencies between 2 GHz and 6 GHz, supporting standards that include IEEE 802.11a at 4.9-5.8 GHz, IEEE 802.11b/g at 2.4-2.5 GHz, IEEE 8.216 2.3-2.7 GHz and 2.8-3.3 GHz. Other wireless circuits provide operation from these frequencies to frequencies of 66 GHz (IEEE 802.16) and above for military and civil radar applications.

As more performance and functionality is built into IC devices, the sending of signals internal to the semiconductor integrated circuit (IC) becomes a challenge, as does managing the impedance of the transmission lines interconnecting the different elements of the circuit. Further, these IC's do not function in isolation and as such it is common for these signals to be routed between multiple IC's on a single circuit board, or from an IC to an antenna, backplane and other electronics. In these scenarios the signal must usually travel through a variety of interconnects such as a package, a printed circuit board and a socket. Generally, the impedance of a signal line through these entities differs from one to another. Any impedance mismatches between these entities and the transmission lines causes noise owing to reflections of energy at the impedance boundaries and increases power consumption, as the reflected energy is not communicated to the endpoint of the transmission line. In most instances the impedance of such transmission lines meeting manufacturing design rules on such semiconductor platforms are such that the impedances are low, when compared to the industry standards of 50Ω and 75Ω for commercially available microwave connectors, cabling, PCBs, sockets, etc.

Impedance matching such a low impedance semiconductor circuit to one of these requires either providing a matching impedance in series or parallel with the circuit. However, consider a 10Ω semiconductor transmission line to be impedance matched to a 50Ω external load impedance; this is done with a 40Ω series impedance. This significantly affects the design of a semiconductor circuit generating the required signal levels within a low impedance environment.

There exists a need to provide alternative impedance matching in circuit design.

In accordance with a first embodiment of the invention there is provided a meta-material substrate design for supporting a signal line. The design comprises providing initially the target meta-material impedance, the meta-material impedance representing that of the meta-material substrate and forming a portion of the overall impedance for the signal line to be formed on the meta-material substrate. For the meta-material substrate a first equivalent circuit is provided, and entered into this is a parameter relating to at least one aspect of the meta-material substrate. These aspects being a pre-determined physical characteristic, the target impedance of the meta-material, and a pre-determined electrical property relating to the meta-material substrate.

Determined from this first equivalent circuit is another physical characteristic of the meta-material substrate, this physical characteristic being dependent upon the pre-determined physical characteristic entered into the first equivalent circuit. The physical characteristics of the meta-material thereby providing output design data relating to the required design of the meta-material substrate to provide the desired meta-material impedance.

In accordance with another embodiment of the invention there is provided a computer-readable storage medium having stored thereon computer-executable instructions. The computer readable instructions when executed providing the design for a substrate. The substrate being a meta-material substrate for supporting an electrical signal line. The computer readable instructions initially obtain the target meta-material impedance, the meta-material impedance representing that of the meta-material substrate and forming a portion of the overall impedance for the electrical signal line to be formed on the meta-material substrate.

The computer readable instructions then provide a first equivalent circuit for the meta-material substrate. Entered into this equivalent circuit is a parameter relating to at least one aspect of the meta-material substrate. These aspects being a pre-determined physical characteristic, the target impedance of the meta-material, and a pre-determined electrical property relating to the meta-material substrate.

Determined from this first equivalent circuit is another physical characteristic of the meta-material substrate, this physical characteristic being dependent upon the pre-determined physical characteristic entered into the first equivalent circuit. The physical characteristics of the meta-material thereby providing output design data relating to the required design of the meta-material substrate to provide the desired meta-material impedance.

In accordance with another embodiment of the invention a computer-readable storage medium has stored thereon computer-executable instructions. These instructions when executed by a suitable computing device providing a design parameter for a meta-material substrate. Initially provided is the target line impedance for an electrical signal line to be formed on a meta-material substrate. The instructions then provide a second equivalent electrical circuit for the electrical signal line on the substrate, the second equivalent circuit establishing a transmission line impedance in dependence upon at least a predetermined physical characteristic of the electrical signal line. This transmission line impedance being that of the electrical signal line on a dielectric material, the dielectric material forming a portion of the meta-material substrate.

The instructions then provide a third equivalent circuit, for relating at least the transmission line impedance, target meta-material impedance, and target line impedance; such that the target meta-material impedance in determined, this target being determined in dependence upon at least the target line impedance and transmission line impedance.

The above summary is not intended to represent each disclosed embodiment, or every aspect, of the present invention. Other aspects and example embodiments are provided in the figures and the detailed description that follows.

The invention may be more completely understood in consideration of the following detailed description of various embodiments of the invention in connection with the accompanying drawings, in which.

The exemplary embodiments described in the following descriptions relate to designing transmission lines for signals in circuits and substrates by using meta-materials for the insulator of the circuit or substrate. Meta-materials are materials which are designed to make the signal act in such a way as to make the shape of the signal behave as though the permittivity and permeability are different than the real component permittivity and permeability of the insulator used. It should be noted that the relative permittivity and relative permeability include both real and imaginary components, that is $\epsilon_R = \epsilon_R + j\ \epsilon_R$ and $\mu_R = \mu_R + j\ \mu_R$ It is possible to design meta-materials so as to have the signal respond as if the permittivity and permeability have negative values. In this invention, an insulator material is designed to reduce the noise present from the resonant mode of the signal line. The meta-material is an arrangement of conductors in the insulator that reduces the resonant response of the line on the signal.

Though current approaches to impedance matching rely on positive impedance, it is also possible to use negative impedances to perform impedance matching. A. F. Starr et al. write in their paper titled, "Fabrication and Characterization of a Negative-Refractive-Index Composite Meta-Material," Physical Review B 70, 113102 (2004) of the American Physical Society, "while there have not been many suggested paths toward the design of a material whose effective index-of-refraction is negative, a rigorous approach is to design a material whose electric permittivity ($\epsilon$) and magnetic permeability ($\mu$) are simultaneously negative. While there are no known naturally occurring materials or compounds that exhibit simultaneously negative $\epsilon$ and $\mu$, such materials can be designed to provide effective $\epsilon$ and $\mu$, as derived from effective medium arguments, which are singly or both negative over a finite frequency band."

Such a meta-material in which the permittivity and permeability of a substrate supporting a transmission line is influenced in a negative direction finds a potential role in the design and implementation of such signal transmission lines for high performance IC devices. Consequently, it would beneficial to design such meta-materials without recourse to exhaustive experimentation in order to achieve the desired impedance in conjunction with the transmission line.

Figure 1:
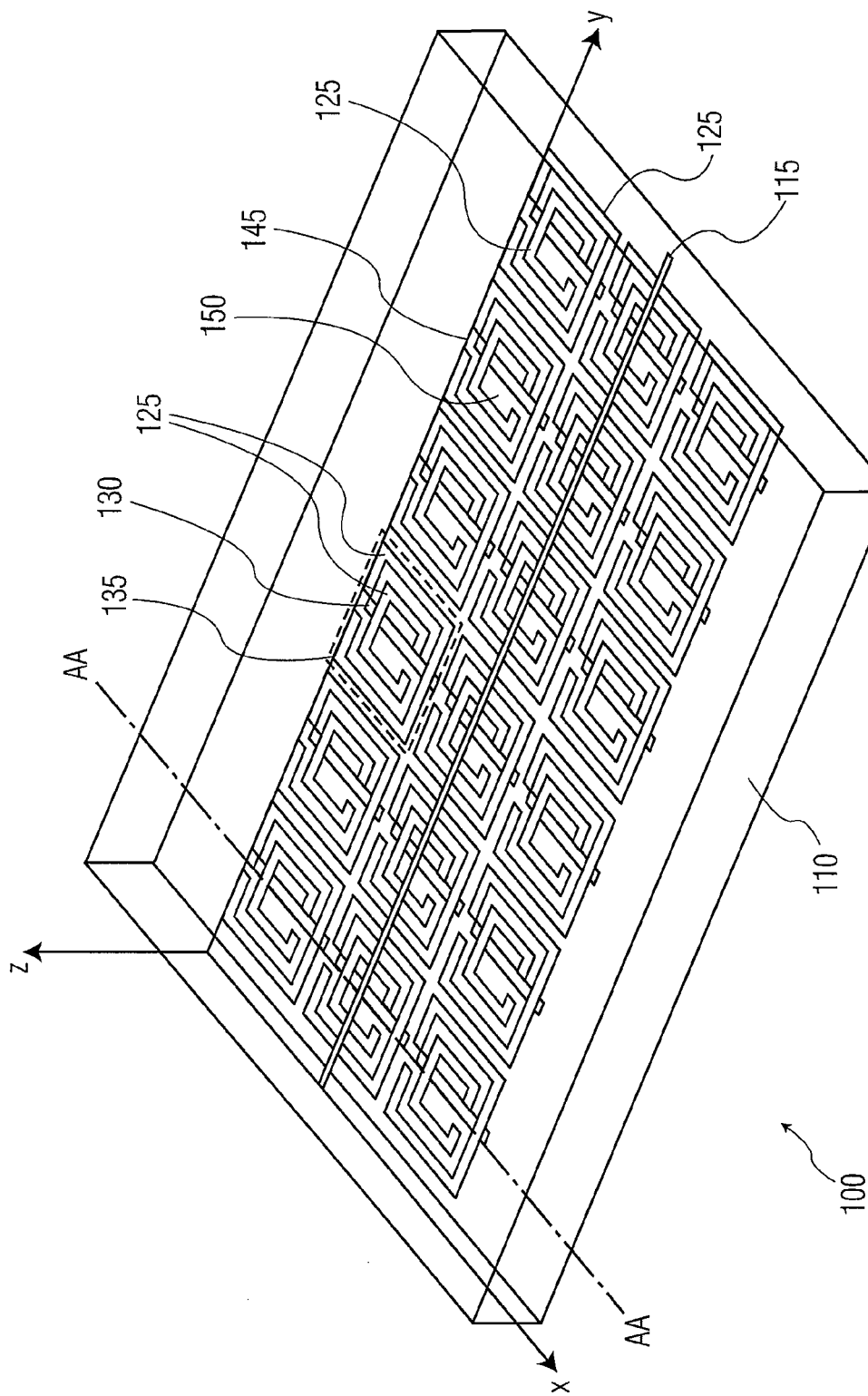
FIG. 1 is an isometric view of a first exemplary layout of meta-material substrate and transmission line.

Shown in FIG. 1 is a first exemplary meta-material substrate and transmission line structure 100. A substrate 110 has been configured as a meta-material. As such within the substrate 110 are a pattern of conductive material 135 (i.e., a motif) arranged as concentric "square-circles" 125 which are hereinafter described as rectangular-like shapes, such shapes include but are not limited to, rectangles and squares. Also within the substrate 110 is a pattern of straight sections of metal 130. The signal transmission line 115 is shown on the surface of the substrate 110. According to an embodiment of the invention consider that the substrate 110, and therein signal transmission line 115, are of a length in the y-direction of 14 mm and that the meta-material is designed to enhance the signal transmission line 115 impedance to reduce reflections, enhance power transfer and reduce signal noise. The sum of the lengths of the rectangular-like shapes 135 is comparable to (and often may match) the length of the signal transmission line 115. The straight sections of metal 130 match the width of the rectangular-like shapes 135. The open rectangular-like shapes 135 in this embodiment are square in nature with a "diameter" of 2.5 mm, each element of the conductive material 135 being characterized by a conductor width of 0.1 mm and conductor thickness of 25 μm. The gaps 145 and 150 within the rectangular-like shapes 125 are 0.2 mm. The length of signal transmission 115 is of width 0.1 mm and thickness 25 μm. The insulator in this meta-material is bismaleimide triazine (BT) resin, a high heat resistant thermosetting resin employed in glass type copper clad laminates for circuit boards.

Figure 2A:
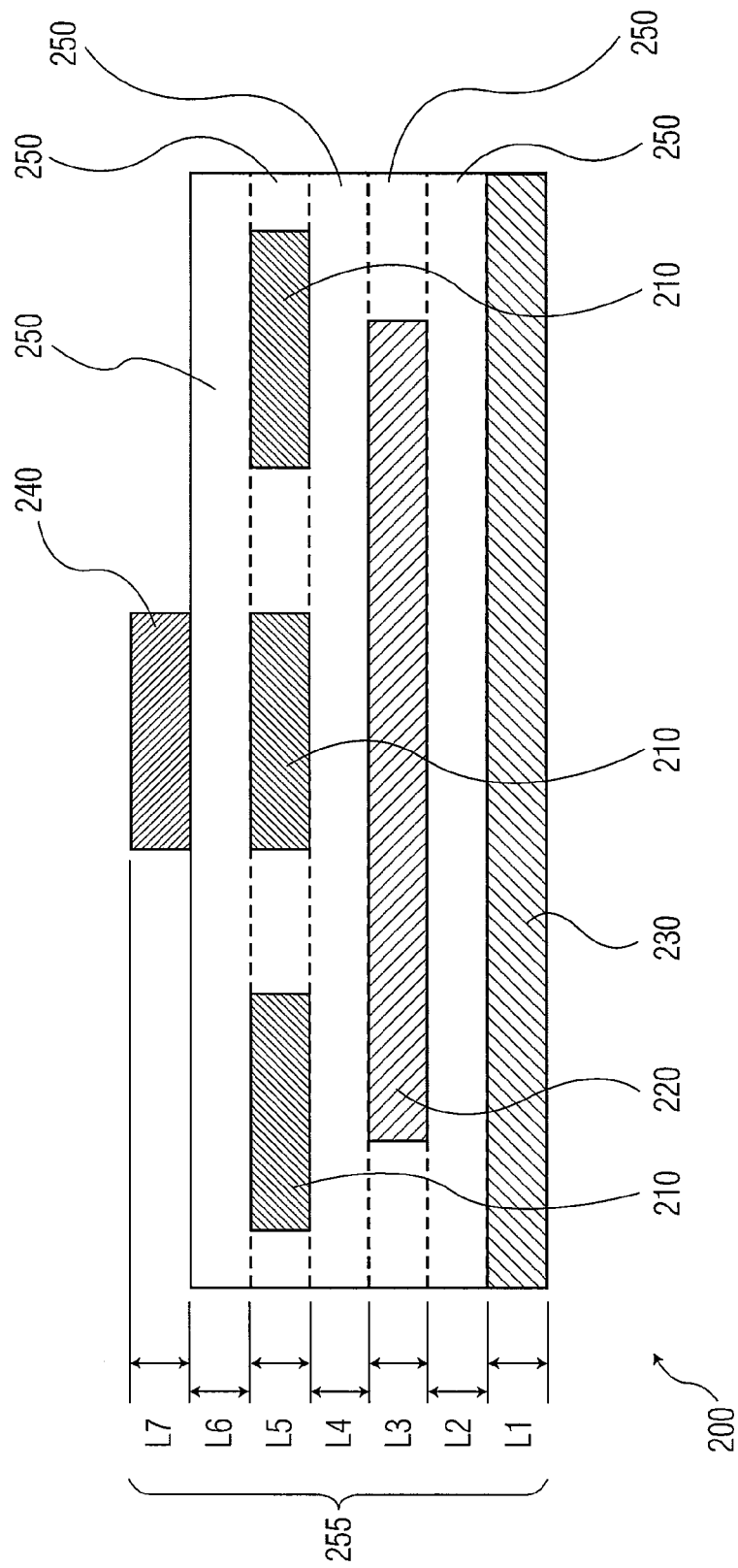
FIG. 2A is a cross-sectional view of the first exemplary meta-material substrate and transmission line layout of FIG. 1.

Referring to FIG. 2 a cross-sectional view of the first exemplary meta-material substrate and transmission line layout 200 of FIG. 1 is shown. The cross-sectional view being along the section AA-AA shown in FIG. 1. The substrate 200 may be constructed as multiple layers 255. Layer 1 (L1) is a ground plane 230 of 25 μm thickness. Upon the ground plane 230, layer 2 (L2) is insulating material 250 of 100 μm thickness. Layer 3 (L3) is where the straight sections of metal 220 is defined within the meta-material substrate and transmission line layout 200 and is also of thickness 25 μm. Layer 4 (L4) is another layer of insulating material 250 of 100 μm thickness. Layer 5 (L5) includes an arrangement of metallic conductors 225 that form the concentric rectangular-like shapes 125 of FIG. 1 and have a thickness of 25 μm. Upon layer 5 (L5) there is a further layer 6 (L6) of insulating material 250 of 100 μm thickness. Signal transmission line 115 of FIG. 1 is shown as cross-sectional conductor 240, defined as layer 7 (L7); a conductor also of thickness 25 μm. Thus, for an exemplary embodiment the meta-material is implemented as the addition of two metallic layers L3 and L5 into the conventional ground plane 230 (L1), insulator material 250, and conductor 240. Additional processing complexity results but as will be shown in FIGS. 3 and 4 a significant enhancement in performance is achieved.

Figure 2B:
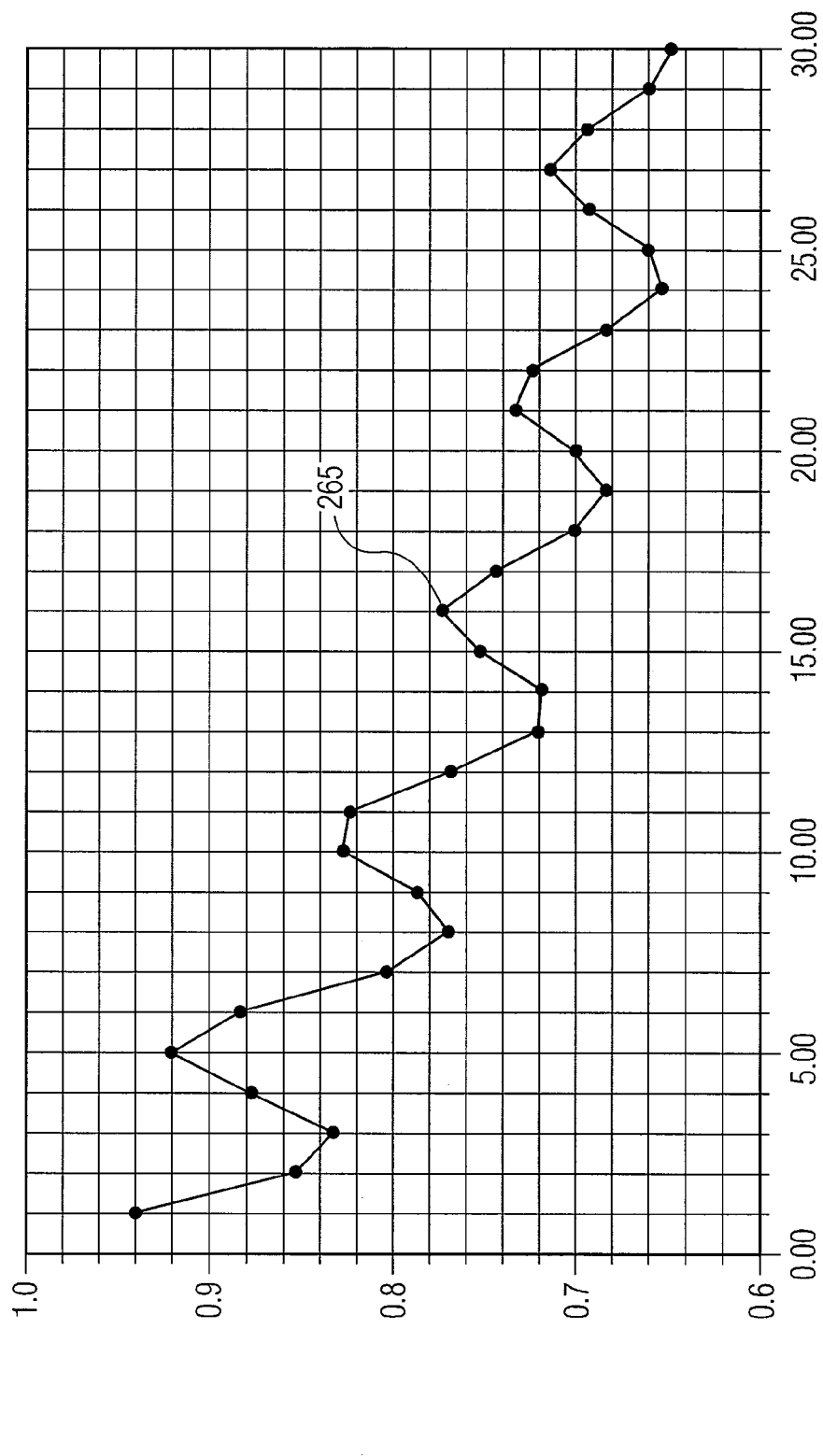
FIG. 2B is a plot of microwave impedance match (S-parameter) as a function of frequency for the signal transmission line of FIG. 1 absent the meta-material.

FIG. 2B is a plot of microwave impedance match (S-parameter) as a function of frequency for the signal transmission line of FIG. 1 absent the meta-material. The structure modeled being a 14 mm signal transmission line as described in FIG. 1, which has a characteristic impedance of $Z_0$=83 ohm on BT resin insulator in the same manner as that for FIG. 1 but without metal rectangular-like shapes 135 and straight sections of metal 130. Shown is a plot 260 of the S-parameter versus signal frequency. A square-wave input signal is driven through the signal line. Curve 265 shows the ratio of output voltage to input voltage, e.g. the signal integrity, declining as frequency increases from 1 GHz to about 30 GHz. The S-parameter being equal to the ratio $V_{OUT}/V_{IN}$, where $V_{OUT}$ is the output voltage from the transmission line and $V_{IN}$ is the voltage applied to the transmission line. As the input frequency increases, the amplitude of the waveform decreases, indicating a reduction in output signal and reduction in transmission through the signal transmission line. The solution to an EM model-meshing algorithm is defined at 20 GHz (which is a 7.5 mm edge length) for ANSOFT proprietary software (authored by ANSOFT Corporation, Pittsburgh, Pa.) used in obtaining the data for the present invention.

Figure 2C:
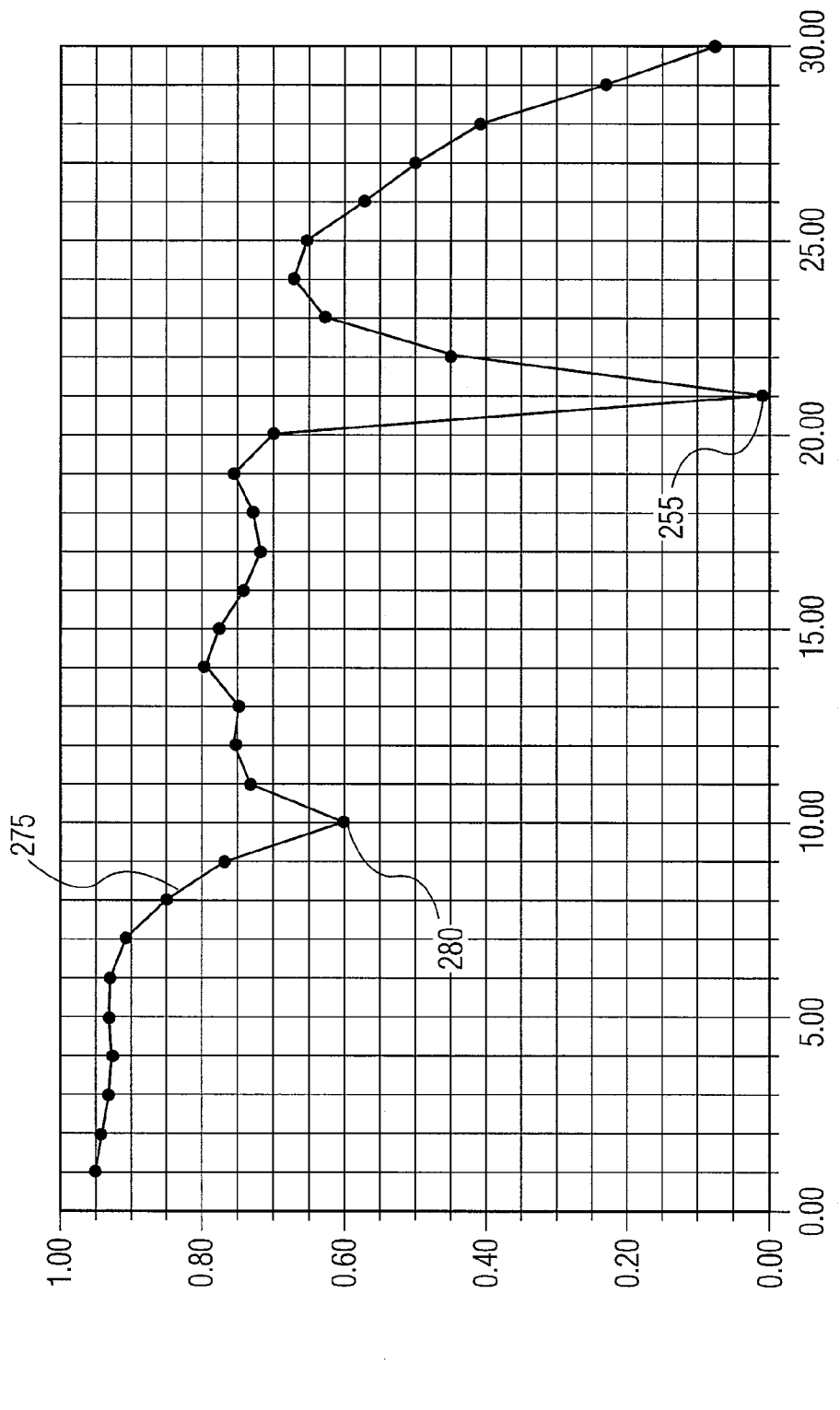
FIG. 2C is a plot of microwave impedance match (S-parameter) as a function of frequency for the signal transmission line of FIG. 1 with the meta-material.
Figure 3:
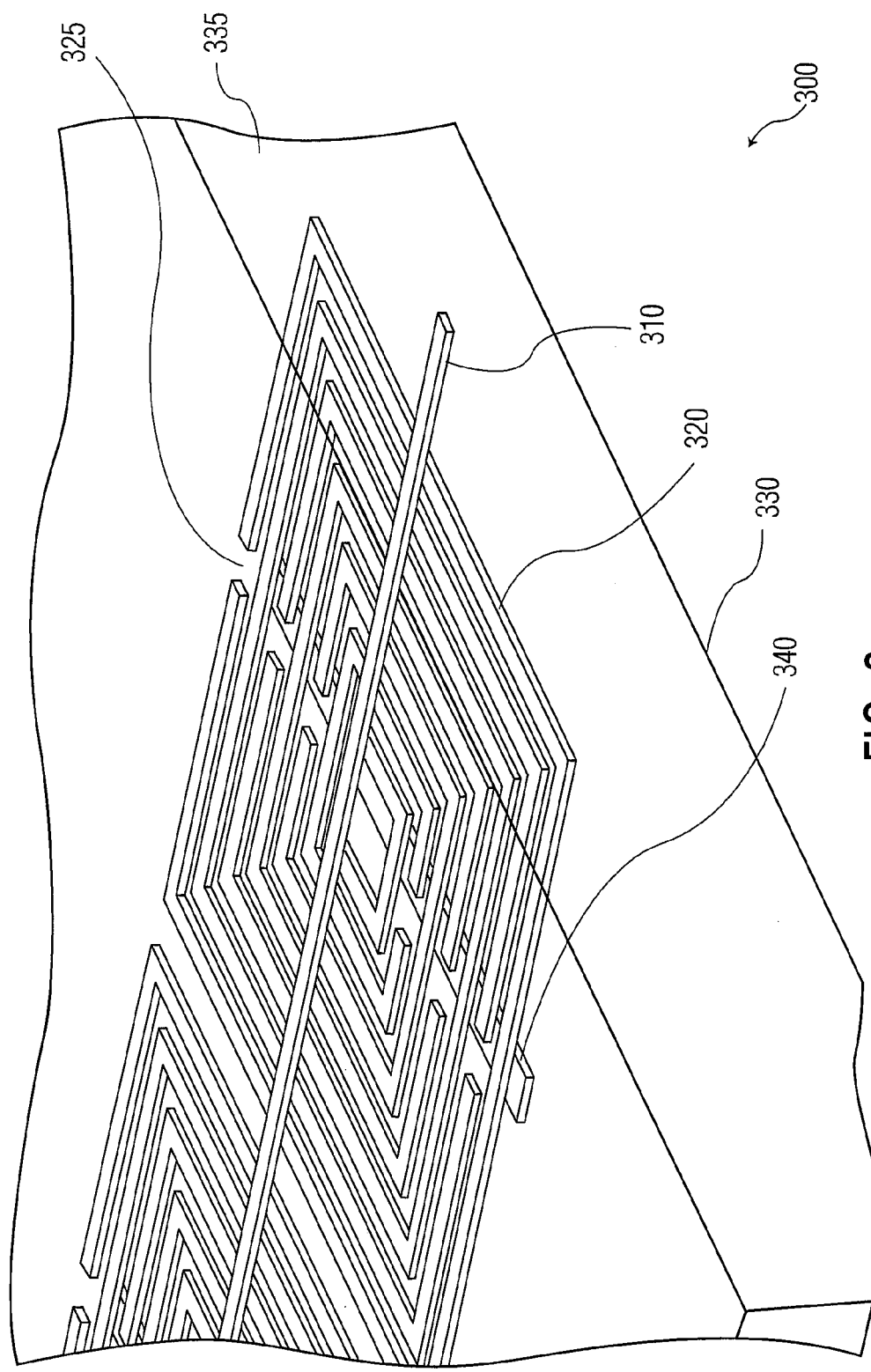
FIG. 3 is an expanded isometric view of a second exemplary layout.

FIG. 2C is a plot of microwave impedance match (S-parameter) as a function of frequency for the signal transmission line of FIG. 1 with the meta-material. The structure modeled being a 14 mm signal transmission line as described in FIG. 1, which has a characteristic impedance of $Z_0$=83 ohm, without meta-material, on BT resin insulator in the same manner as that for FIG. 1 but now includes metal rectangular-like shapes 135 and straight sections of metal 130. A plot 270 of S-parameter v. frequency shows curve 275 having two minima 280 and 290 at 10 GHz and 21 GHz, respectively. These two frequencies may be thought of as the resonant frequencies of the signal line on the meta-material. The 10 GHz and 21 GHz are first and second harmonic frequencies, respectively. Excepting these two frequencies, the downward trend of the $V_{OUT}/V_{IN}$ ratio of FIG. 3 is not present at other frequencies. The meta-material structure maintains the S-parameter (e.g., which is related to signal integrity) above 0.60 throughout the frequency range of 4 GHz to 25 GHz.

FIG. 3 is an expanded isometric view of a second exemplary layout of a meta-material substrate and transmission line layout. The structure is similar to that shown in FIG. 1 but there are now additional concentric squares. Referring to FIG. 3 a substrate 300 has a signal strip 310 on an insulated substrate 335. Underneath the signal strip 310 are seven conductive concentric squares 320. Each square has an opening 325 about the center of a given side. The squares are arranged so that openings are not present on adjacent squares. Underneath the seven concentric squares 320, separated by insulated substrate at a pre-determined distance a straight line strip of metal 340 runs below the areas defined by the openings 325 and is oriented in a direction traversing the signal strip 310. The meta-material is disposed above a ground plane 330.

Figure 4:
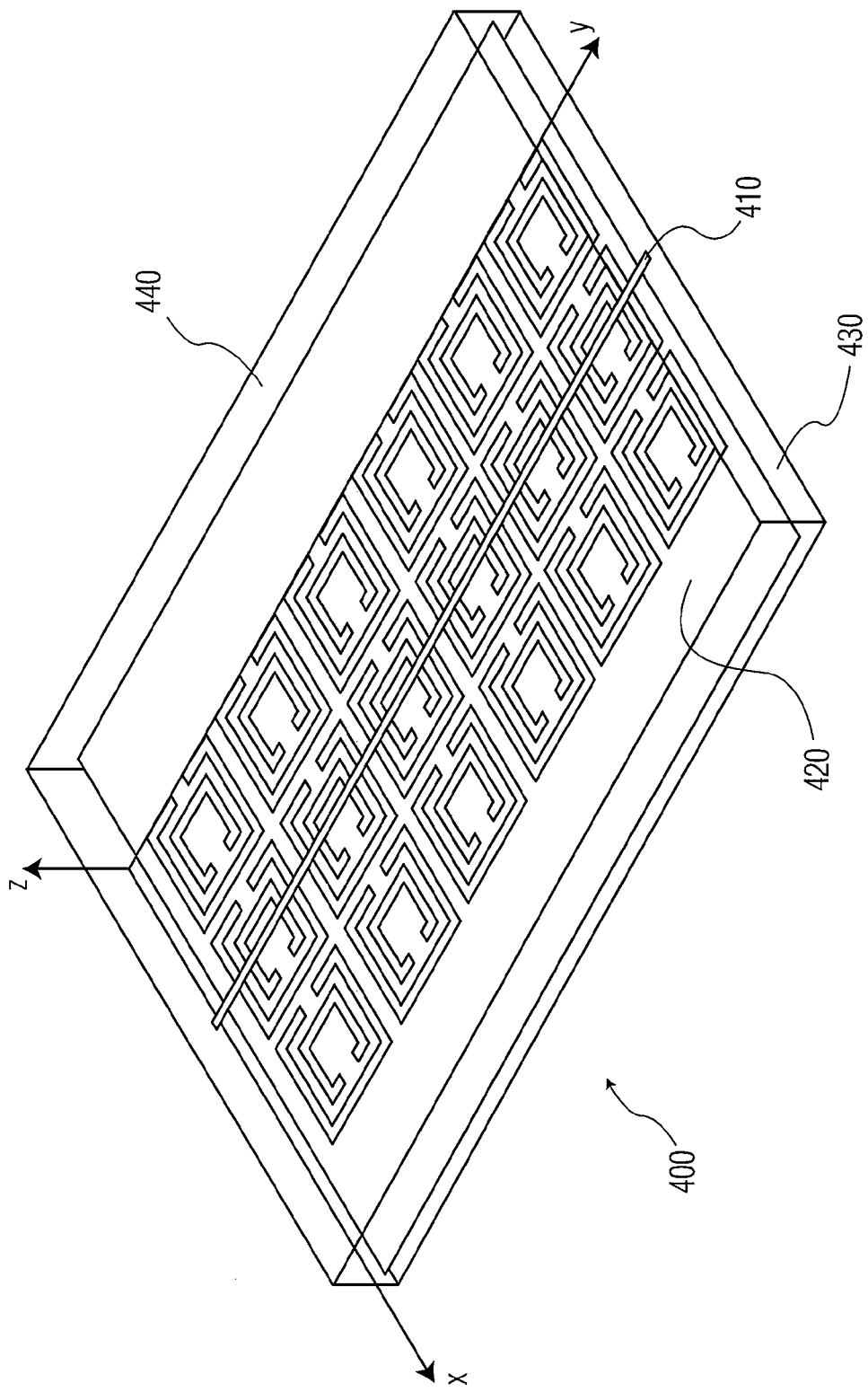
FIG. 4 is an isometric view of a third exemplary layout of a meta-material substrate and transmission line.

Referring to FIG. 4 a third exemplary embodiment of a meta-material substrate and transmission line layout is shown as a meta-material substrate 400 having a signal line 410 on insulating material. At a predetermined distance below the signal line, a floating metal 420 having concentric squares is defined. In contrast, with the previous embodiments, the squares are regions with an absence of metal. At another predetermined distance from the floating metal 420 is a ground plane 430. Such a metal substrate may be constructed in multiple layers as discussed in reference to FIG. 2.

Figure 5:
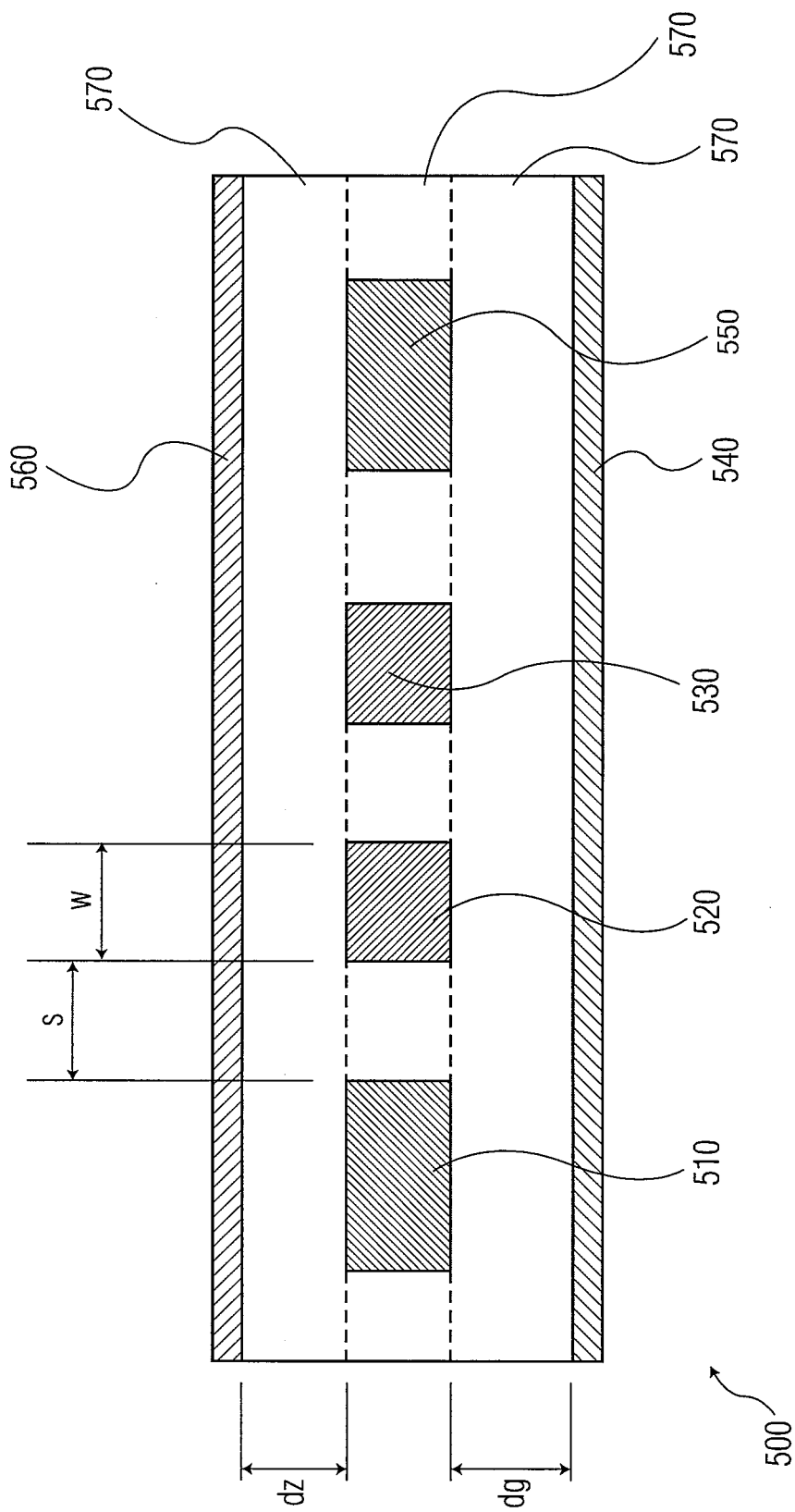
FIG. 5 is an exemplary cross-sectional view of a fourth exemplary meta-material substrate and transmission line layout of FIG. 4.

Shown in FIG. 5 is a fourth exemplary layout of a fourth exemplary embodiment of a meta-material substrate and transmission line layout. The structure shown is of comparable structure to that within FIG. 4 but is now concentric squares of metal within the insulated material. Shown is a substrate 500 comprising a lower ground plane 540, an upper transmission conductor 560. Shown are the insulated material 570 with an inner pair of first conductor elements 520 and 530 and outer pair of second conductor elements 510 and 550.

Figure 6:
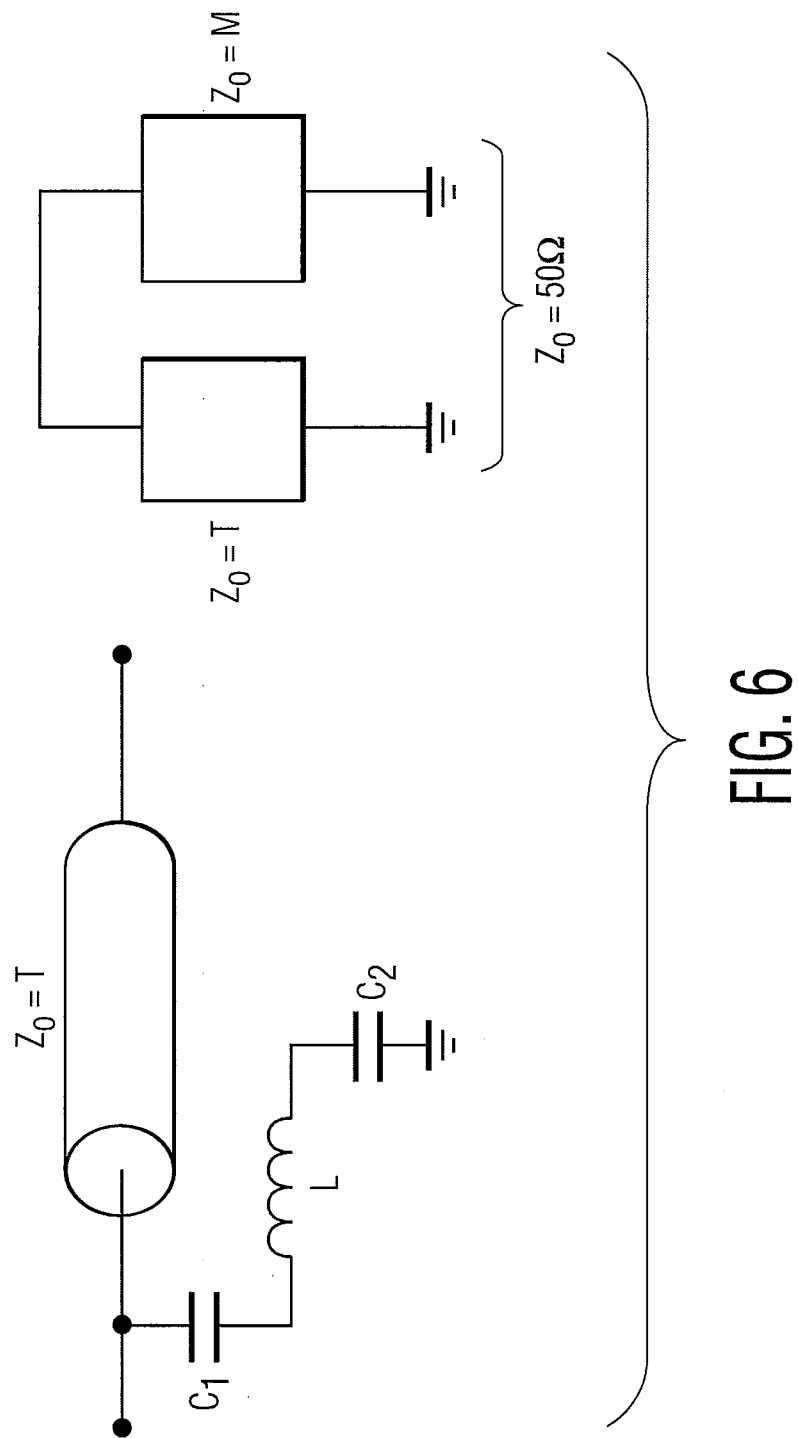
FIG. 6 is a schematic circuit for a transmission line on a substrate comprising meta-materials.

Now consider that the inner pair of conductors 520 and 530 are of width w, and are spaced apart, and from the outer pair of conductors 510 and 550 by a separation s. Further, the inner pair of conductors 520 and 530 are spaced away from the transmission line conductor by a separation dz, and from the ground plane by a separation dg. The effective electrical circuit for the transmission line, with meta-material elements, as shown in FIG. 6 is a transmission line of characteristic impedance Zo=T, with distributed capacitance and inductance to ground, the combination of which present a characteristic impedance of Zo=M. The overall combination of these targeted to represent a characteristic impedance of 50Ω to a signal propagating within the structure.

The characteristic impedance M of the meta-material is given by:

$$M = Z_{C1} + Z_L + Z_{C2} \qquad [1]$$

wherein the meta-material combination of inner pair of first conductors 520 and 530 and outer pair of second conductors 510 and 550 present a first impedance $Z_{C1}$ with respect to the upper transmission conductor 560, second impedance $Z_{C1}$ with respect to the ground plane 540, and $Z_L$ due to their effective inductance.

As with standard parallel plate capacitors the capacitance for the inner pair of first conductors 520 and 530, and outer pair of second conductors 510 and 550, can be calculated using:

$$C = \epsilon A/d \qquad [2]$$

where $\epsilon$ is the electric permittivity of the material between the conductors, A is the effective area of the capacitor, and d is the separation of conductors. From the structure of inner and outer "circular" traces $$A = w\xi \qquad [3]$$

where w is the trace width of a conductor within the circle, and $\xi$ is the length of the trace with the circle. Hence:

$$C = \epsilon w\xi/d \qquad [4]$$

Similarly the inductance can be calculated using $$L = \mu d/A \qquad [5]$$

where $\mu$ is the electrical permeability of the material between the conductors. Again, for the structure of inner and outer "circular" traces $$L = \mu d/(w\zeta) \quad [6]$$

Transforming equation [1] yields $$M + sC1 + sL + sC2 \quad [7]$$

Where s is the spacing between conductors. Substituting for [4] and [6] yielding:

$$M = (s\epsilon\delta z/w\xi) + (s\mu\delta g/w\xi) + (\delta g/s\epsilon w\xi) \quad [8]$$

Where $\delta z$ is the separation of the conductors 510, 520, 530, and 550 from the upper transmission conductor 560 and $\delta g$ is the separation of the conductors 510, 520, 530, 550 from the ground plane 540. Re-arranging [8] yielding:

$$Mw\zeta = \left(\frac{s\epsilon(s\epsilon\delta z + s\mu\delta g) + \delta g}{s\epsilon}\right) \quad [9]$$

$$s^2(\epsilon^2\delta z + \epsilon\mu\delta g) - s\epsilon Mw\zeta + \delta g = 0 \quad [10]$$

$$w\zeta = \left(\frac{s_0^2(\epsilon^2\delta z + \epsilon\mu\delta g) + \delta g}{s_0 M}\right) \quad [11]$$

where $s_0$ is the target spacing for the frequency of operation and is normally defined from the manufacturing process of the meta-material structure 500.

Hence, the conductor width and conductor length are in this exemplary embodiment defined in respect of the known parameters of the meta-material structure 500, these being separation of the conductors from the upper transmission conductor 560, separation of the conductors from the ground plane 540, desired impedance M at the operating frequency of interest, and the electrical permittivity and permeability of the material forming the dielectric insulator 570 of the meta-material structure 500.

Figure 7:
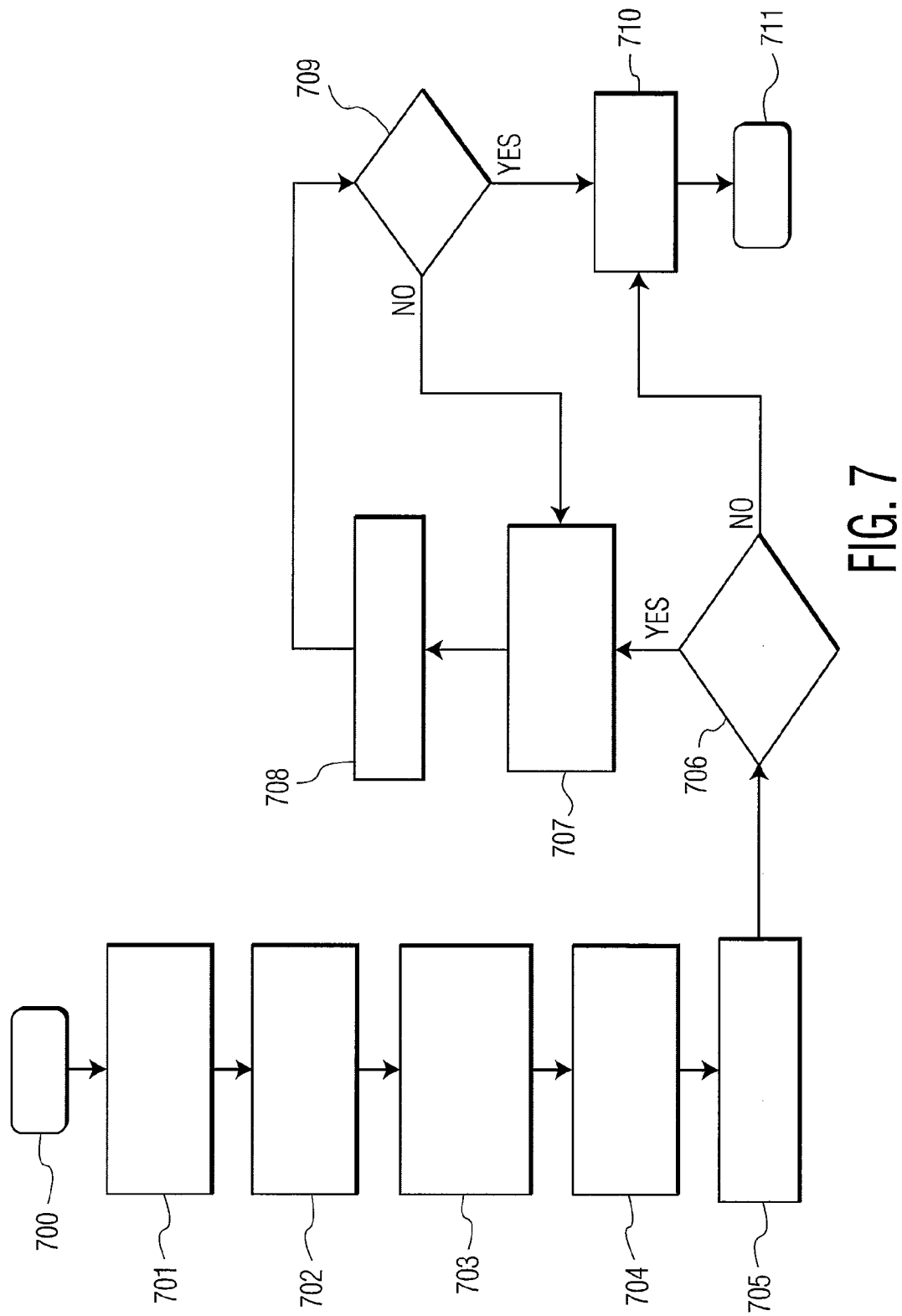
FIG. 7 is an exemplary flow diagram for the design of a meta-material substrate for a circuit and corresponding transmission line.

Referring to FIG. 7, an exemplary flow diagram for the design of a meta-material substrate for a circuit and corresponding transmission line is shown. In step 700 a design is initiated, resulting in step 701 of a determination of the target transmission line impedance. From the design of the transmission line the target impedance for the meta-material structure is derived in step 702. This value and the frequency for which this impedance is desired are then entered into the design tool at step 703. Then, based upon the meta-material structure and processing the trace width is established in relation of the minimum feature design rule of the processing and entered in step 704.

The result provided by the design tool in step 705 is the target structure parameters. According to the design method presented supra the output of step 705 being for example the product (w$\zeta$) of Eqn. 11 as described in respect of FIGS. 5 and 6. In step 706 there is a decision made as to whether the resulting design parameters are sufficient to progress to manufacturing or whether additional simulation is required. If step 706 results in a decision that no further modeling is required then the process proceeds to step 710 for the layout of the meta-material structure and ends at step 711.

Should further modeling be deemed necessary in step 706 then the flow proceeds instead to step 707 where the resulting parameters from step 705 are entered into the second model. The second model is run in step 708 resulting in a results verification step at 709. Should the second model results be acceptable the process proceeds to step 710 for the layout of the meta-material structure and ends at step 711. Should the results be considered inappropriate the process returns to step 707 for refinement of the structure parameters and re-calculation.

The design method outlined in respect of FIGS. 5 and 6 and the Eqns. 1 through 11 is a representative embodiment of the steps 701 through 705 of FIG. 7. As outlined in step 706 a determination is made in respect of whether the modeling is sufficient. A representative determination optionally includes whether the meta-material structure is less than $1/10^{th}$ of the microwave wavelength of the signal frequency of interest. Sufficient accuracy for many applications being likely achieved for such short meta-material structures.

Figure 8A:
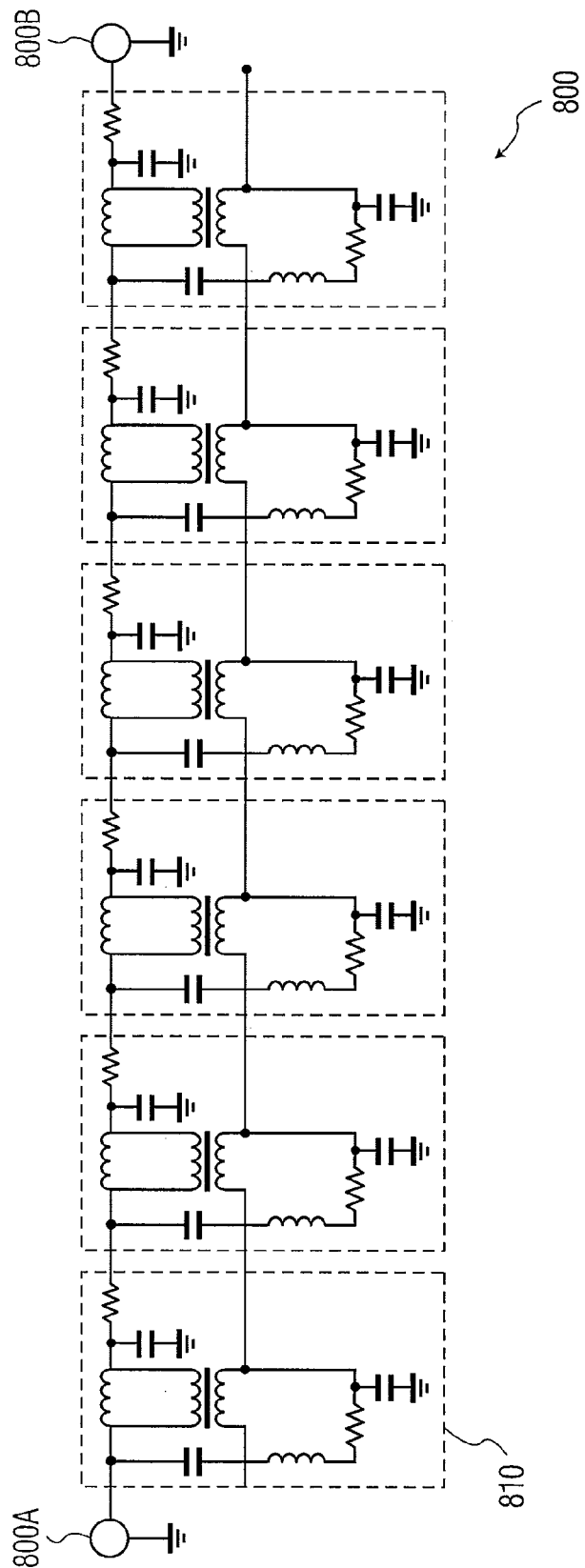
FIG. 8A is an exemplary tank circuit diagram for a meta-material transmission line structure.

However, if determination is that additional modeling is required this could include the inclusion of additional RLC parameters within the model to include mutual inductance and distributed line effects, or extend to more complete electromagnetic modeling tools such as Finite Element Modeling (FEM) and EM model-meshing algorithms. It would be apparent to one skilled in the art that exploiting additional elements into models has benefits of speed and simplicity. Such an extended circuit model is shown in FIG. 8A where a tank model 800 is presented for the multiple meta-material structures. As shown a signal is applied at the input port 800A of the transmission line and is received at the output port 800B. As shown the tank model comprises a serial cascade of discrete tank circuits 810, each representing one meta-material structure, such as the structures presented in FIGS. 1, 3 and 4.

Figure 8B:
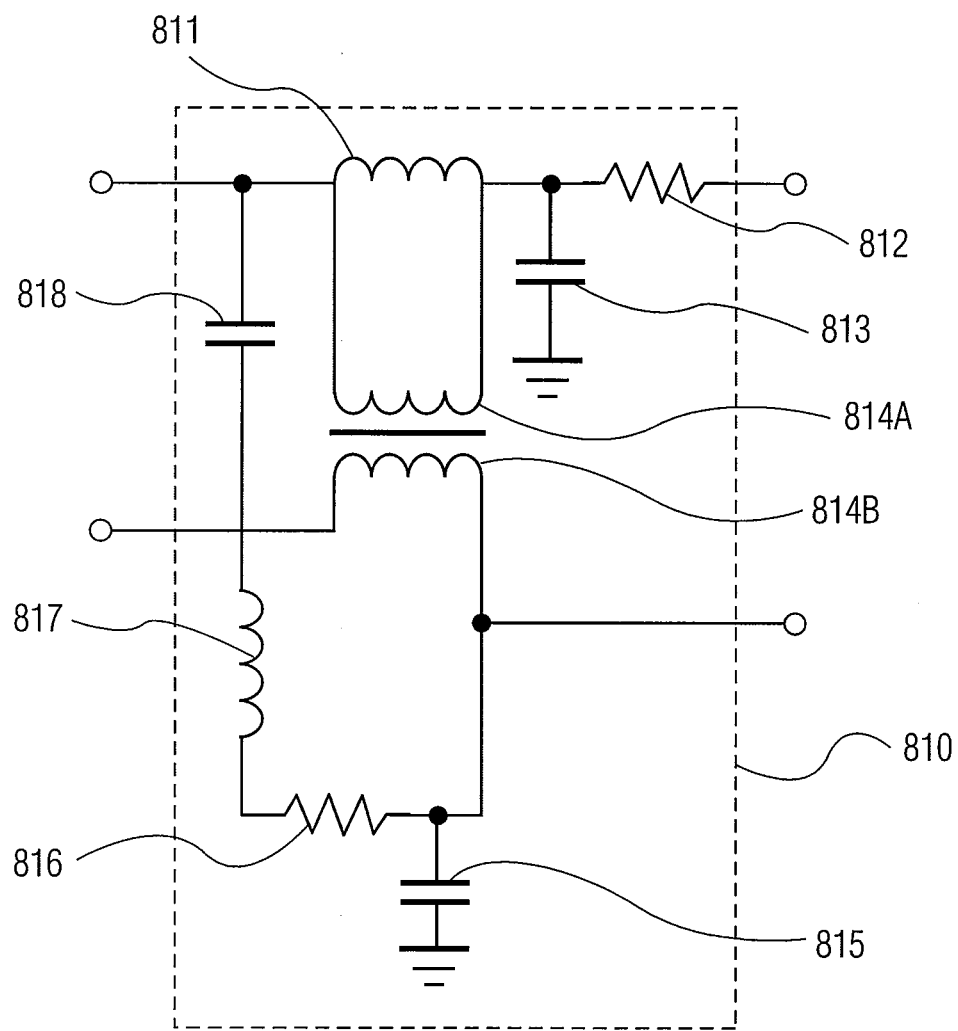
FIG. 8B is an exemplary schematic of a tank circuit forming part of the tank circuit of FIG. 8A.

Referring to FIG. 8B an exemplary schematic of a discrete tank circuit 810 forming part of the tank model 800 of FIG. 8A is provided. As shown the discrete tank circuit 810 comprises a first inductor 811 and first resistor 812 in series forming the circuit representation of the upper conductor, which is coupled to ground via first capacitor 813. In parallel to the first inductor 811 are second and third inductors 814A and 814B representing the floating conductors of the meta-material structure. Further between the upper conductor and ground are second capacitor 819, fourth inductor 817, second resistor 816, and third capacitor 815. As such the dual capacitor and single inductor model of FIG. 6 is now extended to 3*N capacitors, 4*N inductors, and 2*N resistors, where N is the number of discrete tank circuits 810 within the tank model 800.

While the present invention has been described with reference to several particular example embodiments, those skilled in the art will recognize that many changes may be made thereto without departing from the spirit and scope of the present invention, which is set forth in the following claims.

The invention claimed is:

1. A method of providing a meta-material substrate design for supporting a signal line comprising:
   providing a target meta-material impedance, the meta-material impedance representing that of the meta-material substrate and forming a portion of the overall impedance for the signal line formed on the meta-material substrate;
   providing a first equivalent circuit for the meta-material substrate;
   inputting into the first equivalent circuit a parameter relating to at least one of a pre-determined physical characteristic of the meta-material substrate, the target meta-material impedance, and a pre-determined electrical property of the meta-material substrate;
   determining from the first equivalent circuit in dependence upon at least the input pre-determined physical characteristic at least one other physical characteristic of the meta-material substrate;

providing output design data relating to the pre-determined physical characteristic and the other physical characteristics of the meta-material substrate; and manufacturing the meta-material substrate in dependence upon the at least one other physical characteristics of the meta-material substrate.

2. A method according to claim 1 further comprising:

generating a layout of the meta-material substrate in dependence upon the pre-determined physical characteristics and the other physical characteristics before manufacturing the meta-material substrate, and manufacturing the meta-material substrate according to the layout.

3. A method according to claim 1 comprising:

providing a target line impedance for the signal line on the meta-material substrate;

providing a second equivalent circuit for the signal line on the substrate, the second equivalent circuit for providing a transmission line impedance in dependence upon at least a predetermined physical characteristic of the signal line, the transmission line impedance being that of the signal line on a dielectric material, the dielectric material being that forming a portion of the meta-material substrate;

providing a third equivalent circuit, the third equivalent circuit for relating at least the transmission line impedance, target meta-material impedance, and target line impedance;

determining from the third equivalent circuit the target meta-material impedance in dependence upon at least the target line impedance and the transmission line impedance.

4. A method according to claim 1 wherein, the pre-determined physical characteristic of the meta-material substrate is selected from the group consisting of a thickness, width, length, and shape of an element forming a portion of the meta-material.

5. A method according to claim 4 wherein, the pre-determined physical characteristic of the meta-material substrate is selected from a group of physical characteristics relating to a manufacturable structure geometry of the meta-material substrate.

6. A method according to claim 4 wherein the pre-determined physical characteristic of the meta-material substrate is selected from a group of physical characteristics relating to a manufacturable structure geometry that is derived from manufacturing design rules.

7. A method according to claim 1 wherein, the pre-determined electrical property of the meta-material substrate is selected from a group consisting of at least one of permittivity and permeability of a material comprising a portion of the meta-material.

8. A method according to 7 wherein the pre-determined electrical property of the meta-material substrate is selected from a group of electrical properties relating to a manufacturable structure geometry for the meta-material substrate.

9. A method according to claim 7 wherein the pre-determined electrical characteristic of the meta-material substrate is selected from a group of electrical characteristics relating to a manufacturable structure geometry that is derived from manufacturing design rules.

10. A method according to claim 1 wherein, providing the first equivalent circuit comprises providing a design for the meta-material substrate comprising:

a dielectric stack, the dielectric stack being one of a plurality of layers of dielectric material, the dielectric stack having a topside surface and an underside surface;

a conductor, the conductor being one layer of a plurality of layers of conductive material arranged into pre-determined shapes, the conductive material enveloped by the dielectric material, the conductive material disposed within at least one of the plurality of layers of dielectric material and being characterized by at least a first pre-determined distance from the topside surface and at a second predetermined distance from the underside surface.

11. A method according to claim 10 wherein, the pre-determined physical characteristics of the meta-material substrate is selected from a group consisting of a thickness, width, length, and shape of at least one of the conductive material and dielectric material.

12. A method according to claim 10 wherein, the pre-determined electrical characteristic of the material substrate is selected from a group consisting of permittivity and permeability of at least one of the dielectric material and the conductive material.

13. A method according to claim 10 wherein, providing the pre-determined shapes comprises providing at least an array of a pattern of at least one of shapes and a series of concentric shapes on a first pre-determined layer of the plurality of layers of conductive material.

14. A method according to claim 13 wherein, providing the series of concentric shapes comprises providing at least one of concentric circles, concentric regular polygons, concentric regular polygons with at least a section of one side removed about a center point, and concentric shapes that are rectangular.

15. A method according to claim 10 wherein, providing the pre-determined shapes comprises providing a strip, the strip being on second predetermined layer of the plurality of layers of conductive material.

16. A method according to claim 10 wherein, providing the conductive material comprises providing a sheet of metallization, the metallization sheet being configured into pre-determined shapes wherein the conductive material is absent.

17. A computer-readable storage medium having stored thereon computer-executable instructions for when executed resulting in a method of providing a design for a meta-material substrate, the method comprising:

providing a target meta-material impedance, the meta-material impedance representing that of the meta-material substrate and forming a portion of the overall impedance for a signal line formed on the meta-material substrate;

providing a first equivalent circuit for the meta-material substrate;

inputting into the first equivalent circuit a parameter relating to at least one of a pre-determined physical characteristic of the meta-material substrate, the target meta-material impedance, and a pre-determined electrical property of the meta-material substrate;

determining from the first equivalent circuit in dependence upon at least the input pre-determined physical characteristic at least one other physical characteristic of the meta-material substrate;

providing output design data relating to the pre-determined physical characteristic and the other physical characteristics of the meta-material substrate;

transferring the parameter relating to at least one of the pre-determined physical characteristic of the meta-material, the target meta-material impedance, and a pre-determined electrical property of the meta-material to at least a pre-determined first part of a manufacturing operation;

transferring the at least one other physical characteristic of the meta-material to at least a predetermined second part of a manufacturing operation; and resulting in the manufacturing of the substrate.

18. A computer-readable storage medium having stored thereon computer-executable
instructions for when executed resulting in a method of providing a design for a substrate, the method comprising:

providing a target line impedance for a signal line on the substrate, the substrate configured as a meta-material;

providing a second equivalent circuit for the signal line on the substrate, the second equivalent circuit for providing a transmission line impedance in dependence upon at least a predetermined physical characteristic of the signal line, the transmission line impedance being that of the signal line on a dielectric material, the dielectric material being that forming a portion of the meta-material substrate;

providing a third equivalent circuit, the third equivalent circuit for relating at least the transmission line impedance, target meta-material impedance, and target line impedance;

determining from the third equivalent circuit the target meta-material impedance in dependence upon at least the target line impedance and the transmission line impedance;

transferring the transmission line impedance, the target meta-material impedance, and the target line impedance to a manufacturing operation; and resulting in the manufacturing of the substrate.

* * * * *

UNITED STATES PATENT AND TRADEMARK OFFICE
CERTIFICATE OF CORRECTION

| | | |
|---|---|---|
| PATENT NO. | : 8,451,072 B2 | |
| APPLICATION NO. | : 12/525583 | |
| DATED | : May 28, 2013 | |
| INVENTOR(S) | : Wyland | |

It is certified that error appears in the above-identified patent and that said Letters Patent is hereby corrected as shown below:

On the Title Page, Item (54) and in the specification, Column 1, Lines 1-2, the title should be "Design Method for Transmission Lines Using Meta-Materials"

Signed and Sealed this
Ninth Day of July, 2013

Teresa Stanek Rea
*Acting Director of the United States Patent and Trademark Office*